United States Patent
Unkrich et al.

(10) Patent No.: US 7,800,457 B2
(45) Date of Patent: Sep. 21, 2010

(54) SELF-CALIBRATING TEMPERATURE-COMPENSATED OSCILLATOR

(75) Inventors: Mark A. Unkrich, Emerald Hills, CA (US); Richard C. Ruby, Menlo Park, CA (US); Wei Pang, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 134 days.

(21) Appl. No.: 11/950,644

(22) Filed: Dec. 5, 2007

(65) Prior Publication Data

US 2009/0146746 A1 Jun. 11, 2009

(51) Int. Cl.
*H03B 5/32* (2006.01)

(52) U.S. Cl. .............................. 331/158; 331/2; 331/47; 331/176; 331/162

(58) Field of Classification Search ................ 331/2, 331/47, 176, 158, 162
See application file for complete search history.

(56) References Cited

U.S. PATENT DOCUMENTS

| | | | | |
|---|---|---|---|---|
| 4,325,036 A | * | 4/1982 | Kuwabara | ................... 331/176 |
| 5,200,714 A | * | 4/1993 | Hayashi | ....................... 331/66 |
| 5,587,620 A | | 12/1996 | Ruby et al. | |
| 5,873,153 A | | 2/1999 | Ruby et al. | |
| 6,507,983 B1 | | 1/2003 | Ruby et al. | |
| 6,545,550 B1 | * | 4/2003 | Frerking | ....................... 331/44 |
| 6,831,525 B1 | * | 12/2004 | Beaudin et al. | ............. 331/176 |
| 7,065,331 B2 | * | 6/2006 | Korden et al. | ............. 455/150.1 |
| 7,378,916 B2 | * | 5/2008 | Oita et al. | ..................... 331/158 |
| 7,541,878 B2 | * | 6/2009 | Haiut | ............................. 331/2 |
| 2005/0012561 A1 | * | 1/2005 | Young et al. | ................. 331/176 |
| 2007/0222336 A1 | | 9/2007 | Grannen et al. | |

OTHER PUBLICATIONS

R. Ruby et al.,"Micromachined Thin Film Bulk Acoustic Resonators", 1994 IEEE International Frequency Control Symposium, Jun. 1-3, 1994, pp. 135-138.

W.D. Cowan et al., "A 300-MHz digitally compensated SAW oscillator", IEEE Transactions on Ultrasonics, Ferroelectrics and Frequency Control, vol. 35, Issue 3, May 1988; pp. 380-385.

R. Ruby, "Micromachined cellular filters"Microwave Symposium Digest, 1996., IEEE MTT-S International, vol. 2, Jun. 17-21, 1996, pp. 1149-1152.

* cited by examiner

*Primary Examiner*—Joseph Chang
*Assistant Examiner*—Jeffrey Shin (57) ABSTRACT

A self-calibrating temperature compensated oscillator includes a monolithic structure having a first resonator, a second resonator, and a heating element to heat the first and second resonators. The temperature coefficient of the second resonator is substantially greater than the temperature coefficient of the first resonator. A first oscillator circuit operates with the first resonator and outputs a first oscillator output signal having a first oscillating frequency. A second oscillator circuit operates with the second resonator and outputs a second oscillator output signal having a second oscillating frequency. A temperature determining circuit determines the temperature of the first resonator using the second oscillating frequency. A temperature compensator provides a control signal to the first oscillator in response to the determined temperature to adjust the first oscillating frequency and maintain it at a desired operating frequency.

20 Claims, 6 Drawing Sheets

SELF-CALIBRATING TEMPERATURE-COMPENSATED OSCILLATOR

BACKGROUND

Many electronic devices require a highly accurate time base for their operation. In particular, many electronic communication devices (e.g. radio transmitters or receivers for cellular telephones or other wireless communication devices) require a reference oscillator to provide a stable frequency source for proper operation. A reference oscillator typically uses a resonator circuit as part of its operation which drives the performance of the oscillator. Various types of resonators are used for oscillators include quartz crystals, surface acoustic wave (SAW) devices, LC circuits, silicon resonators, ceramics, film bulk acoustic resonators (FBARs), bulk acoustic wave (BAW) resonators, etc. In many devices, it is important to provide a reference oscillator which exhibits low phase noise and is highly accurate over variations in temperature, voltage, age, load, etc. to meet their performance specifications. In particular, some oscillators employ temperature compensation to maintain the frequency variation over the operating temperature range to within a few parts per million (ppm). W. D. Cowan, et al. "A 300-MHz Digitally Compensated SAW Oscillator," IEEE TRANSACTION ON ULTRASONICS, FERROELECTRONICS, AND FREQUENCY CONTROL, May 1988 discloses one example of a self-calibrating temperature compensated crystal oscillator (SCTCXO).

However, prior reference oscillators can be improved upon in a number of ways for many applications. For example, for a cellular telephone or global positioning satellite (GPS) receiver, the component footprint on the printed circuit board is at a premium as further functionality continues to be integrated and the size and weight of the components continue to be reduced. Further size reduction, cost reduction, and performance improvements are areas where the current solutions are continually seeking advances.

What is needed, therefore, is a temperature compensated oscillator with an advantageous combination of size, cost, and performance characteristics.

SUMMARY

In an example embodiment, a self-calibrating temperature compensated oscillator comprises: a monolithic structure including a first resonator, a second resonator, and a heating element adapted to heat the first and second resonators in response to a heater control signal, where a temperature coefficient of the second resonator is substantially greater than a temperature coefficient of the first resonator; a first oscillator circuit adapted to operate in conjunction with the first resonator and to output a first oscillator output signal having a first oscillating frequency, the first oscillating frequency being variable in response to a control signal; a second oscillator circuit adapted to operate in conjunction with the second resonator and to output a second oscillator output signal having a second oscillating frequency; a temperature determining circuit for determining a temperature of the first resonator using the second oscillating frequency; and a temperature compensator adapted to provide the control signal to the first oscillator in response to the determined temperature to maintain the first oscillator output signal at a desired operating frequency.

In another example embodiment, a method is provided for operating a self-calibrating temperature compensated oscillator comprises: providing a first oscillator circuit adapted to operate in conjunction with a first resonator and to output a first oscillator output signal having a first oscillating frequency, the first resonator being one of a film bulk acoustic resonator (FBAR) and a bulk acoustic wave (BAW) device and the first oscillating frequency being variable in response to a control signal; providing a second oscillator circuit adapted to operate in conjunction with a second resonator and to output a second oscillator output signal having a second oscillating frequency, the second resonators being one of an FBAR and a BAW device; determining a temperature of the first resonator based on the second oscillating frequency, using the second resonator as a temperature sensor; and providing the control signal to the first oscillator in response to the determined temperature to maintain the first oscillator output signal at a desired operating frequency.

In yet another example embodiment, a method is provided for calibrating a self-calibrating temperature compensated oscillator comprising a first oscillator circuit adapted to operate in conjunction with a first resonator and to output a first oscillator output signal having a first oscillating frequency, the first oscillating frequency being variable in response to a control signal, and a second oscillator circuit adapted to operate in conjunction with a second resonator and to output a second oscillator output signal having a second oscillating frequency. The method comprises: (1) heating the first resonator to a particular temperature using a heating element provided on a same monolithic structure as the first resonator; (2) providing a control signal to the first oscillator to maintain the first oscillator output signal at a desired operating frequency; (3) determining the second oscillating frequency of the second oscillator circuit using the first oscillating frequency as a reference; (4) storing in data storage frequency calibration data for the particular temperature comprising data corresponding to the second oscillating frequency of the second oscillator circuit and data corresponding to the control signal provided to the first oscillator to maintain the first oscillator output signal at the desired operating frequency; and (5) repeating steps (1)-(4) for a plurality of temperatures spanning a test temperature range.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1:
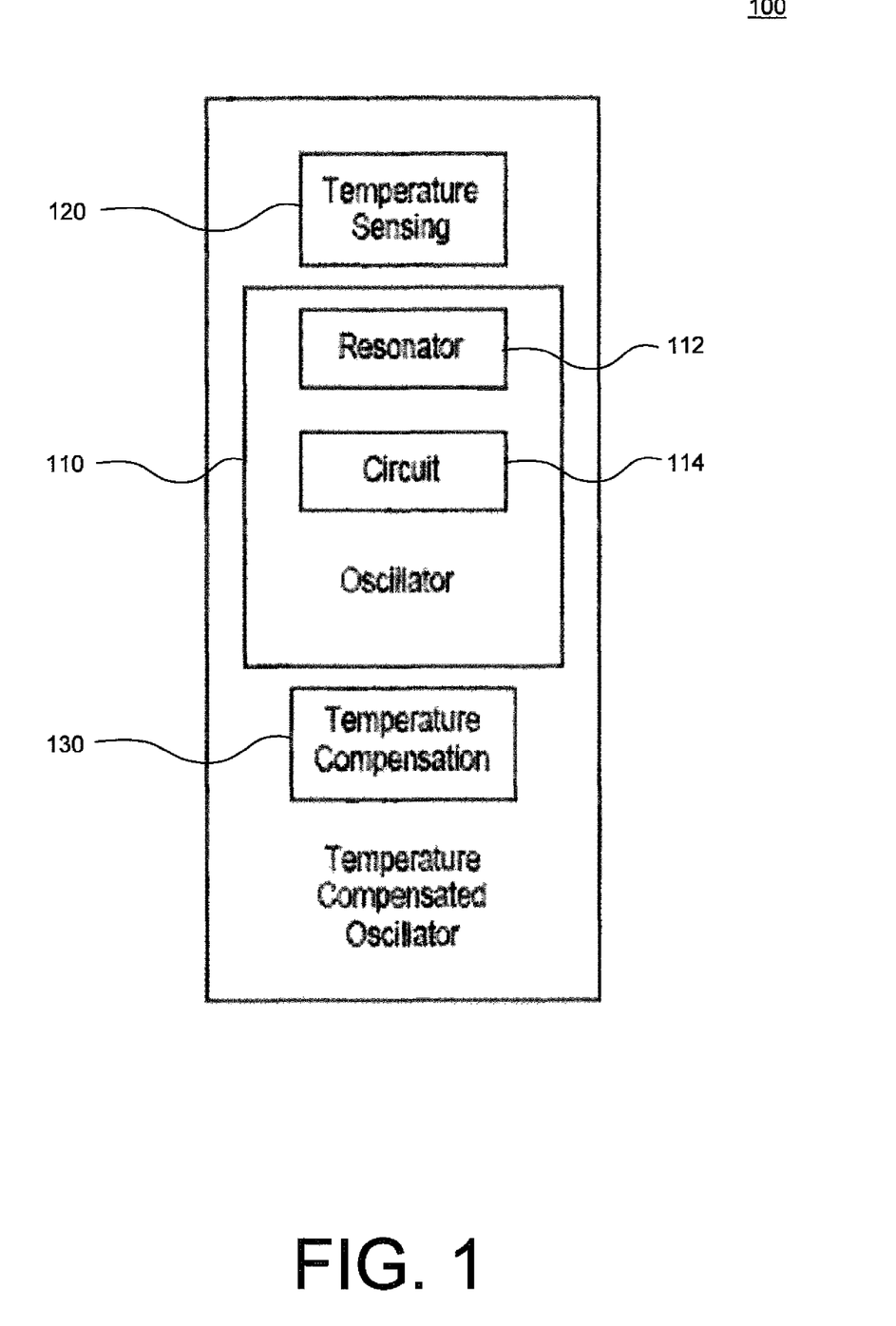
FIG. 1 is a functional block diagram of a temperature compensated oscillator.

FIG. 1 is a functional block diagram of a temperature compensated oscillator (TCO) 100. TCO 100 comprises an oscillator 110, a temperature sensor 120, and a temperature compensator 130. Oscillator 110 comprises a resonator 112 and a circuit 114. Where resonator 112 is a crystal, then TCO 100 is a Temperature Compensated Crystal Oscillator (TCXO).

Oscillator 110 may comprise a Colpitts oscillator, or a Pierce oscillator, or another convenient configuration. The frequency of oscillation of oscillator 110 is dependent upon the temperature of the device due to changes in component parameters as a function of temperature. To reduce this change in frequency over a temperature range, many techniques have been developed in the industry. Without any external compensation, the temperature stability of oscillator 110 can be improved by reducing the changes in the critical component parameters as a function of temperature. Many methods have been employed to further improve the temperature performance of oscillator 110.

By adding additional circuitry, the temperature performance of oscillator 110 can also be substantially improved. For example, by configuring oscillator 110 as a Voltage Controlled Oscillator (VCO), the frequency can be modified electronically. In that case, temperature sensor 120 can measure the temperature of oscillator 110 and temperature compensator 130 can use the measured temperature to modify a control parameter of oscillator 110. In that case, temperature compensator 130 receives a temperature sensing signal from temperature sensor 120 and provides a control voltage control to circuit 114 offset the oscillator frequency by an amount known to compensate for the change in the critical component parameters and oscillator frequency response over temperature.

One of the cost factors in producing TCO 100 is the determination of the frequency behavior over temperature of oscillator 110 and the trimming or programming of compensation circuitry in temperature compensator 130 based upon that frequency response vs. temperature. These must cancel each other out to sufficient accuracy to meet the performance requirements of the product and application. This can require extensive measurement of oscillator 110 over temperature which adds time and cost to the production. This cost generally scales with the accuracy requirements of TCO 100 over temperature.

To reduce the cost of test measurement and programming during production, a self calibration technique may be employed. Self-calibration allows a TCO to set and modify its behavior and frequency accuracy over temperature repeatedly over the life of the component or device in which it is incorporated.

Self-calibration requires the TCO to learn its frequency behavior over temperature. The frequency shifts as a function of temperature may be compensated using digital or analog techniques as mentioned previously. In general, for the device to self-calibrate and change its behavior based on a calibration sequence, it stores a representation of the frequency vs. temperature behavior of the oscillator, and modifies that representation as the behavior changes over time (e.g., due to component aging). A control circuit translates the stored representation of the freq vs. temp behavior to a compensation control to change the oscillator frequency and obtain the final desired frequency behavior. This functionality may be integrated at the oscillator component level as a self-calibrating oscillator component. Alternatively, the oscillator may be part of a host device, such as wireless communication device (e.g., a cellular telephone) or GPS navigation device, with portions of the functionality provided by the other elements of the host device depending upon the application. A cellular telephone, for example, may calibrate the offset of its oscillator frequency using a base station as a reference signal.

Figure 2:
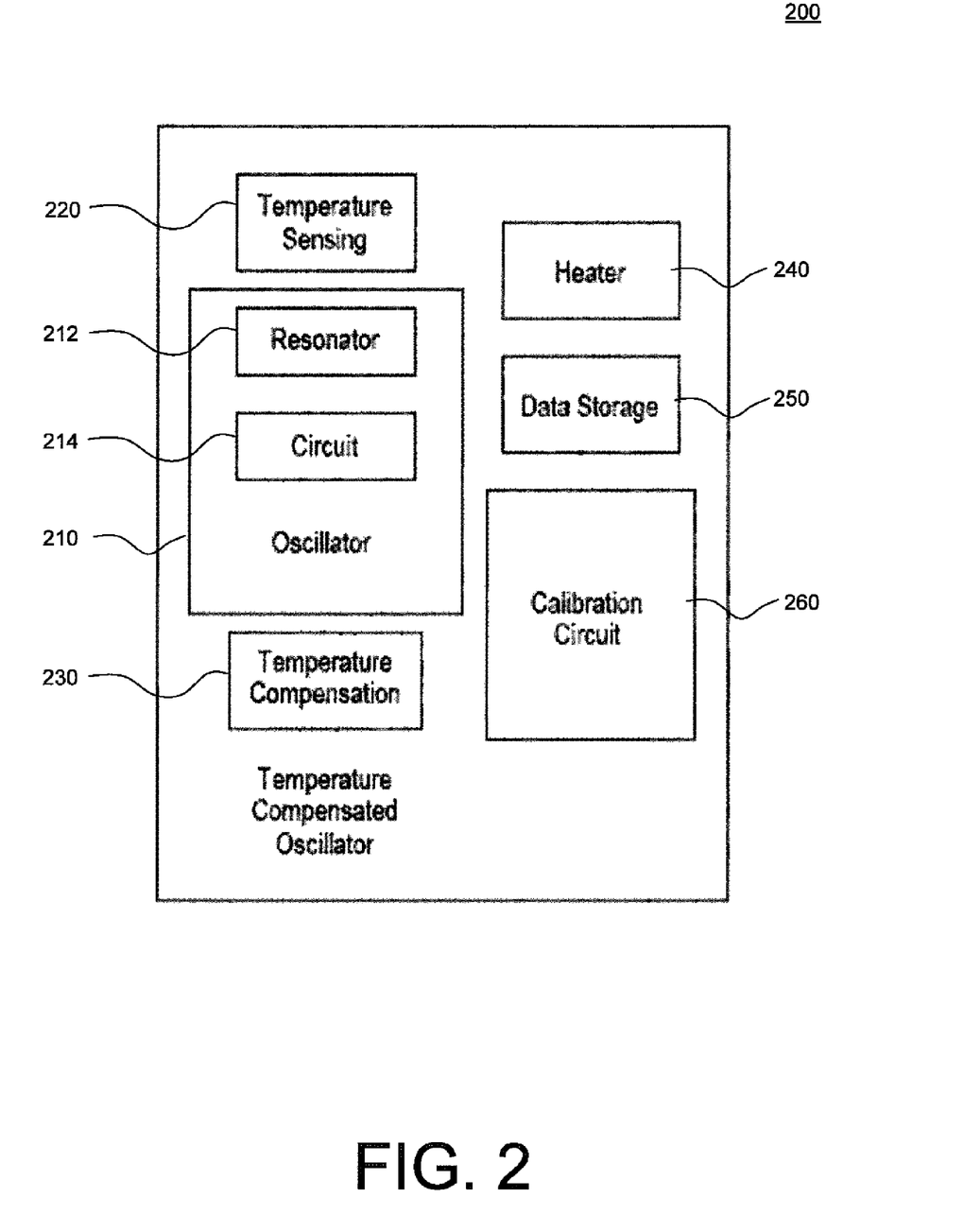
FIG. 2 shows a functional block diagram of a self-calibrating temperature compensated oscillator.

FIG. 2 shows a functional block diagram of a self-calibrating temperature compensated oscillator (SCTCO) 200. SCTCO includes an oscillator 210, a temperature sensor 220, and a temperature compensator 230. Oscillator 210 comprises a resonator 212 and a circuit 214. Compared to TCO 100, SCTCO 200 includes three additional elements: Temperature controller or heater 240, data storage or memory 250, and calibration circuit 260.

Temperature controller 240 must be added which is capable of changing the temperature of oscillator 210 in a controlled fashion to allow measurements to be made at different temperatures. Temperature sensor 220 monitors the temperature of oscillator 210.

Data storage 250 saves the measured results of the oscillator frequency shift as a function of temperature. To store the information even when power is not applied to the SCTCO 200, data storage 250 may comprise non-volatile memory (NVM), such as Flash Memory.

Calibration circuit 260 controls temperature controller 240 to ramp the temperature of oscillator 210 while controlling the measurement of the oscillator frequency vs. temperature behavior during the calibration sequence and storage of this data in data storage 250. The new stored data is then used to modify the compensation control depending upon the actual measured oscillator temperature during normal operation.

Alternatively, calibration circuit 260 may also be used to provide some control of the temperature to further stabilize the oscillator frequency, for example as is done in an oven controlled oscillator. However, in this case, the power dissipated by SCTCO 200 is increased.

In a product implementation, temperature controller 240, data storage 250, and/or calibration circuit 260 may rely upon, or be replaced by, other components of a host device. For example, in a wireless communication device such as a cellular phone, the algorithms for calibration circuit 260 may be stored as a software program in a signal processor within the phone. The stored compensation values may be kept in system Flash memory which is nonvolatile and capable of being recalled after cycling the phone power so the phone does not require a new calibration sequence. Also, it is possible in some cases that a transmitter power amplifier could provide a heating source to oscillator 210.

Ideally, a self-calibration sequence will be very accurate and fast and minimize power requirements. The response time is largely dependent upon the speed of heating oscillator 210. Typically, the temperature performance of resonator 212 dominates the frequency response over temperature of oscillator 210. Therefore, a physically tight coupling between resonator 210, temperature sensor 220, and temperature controller 240 is desired. Also, thermal conduction should be controlled. Low thermal conduction from resonator 212 to other elements of higher thermal mass allows temperature controller 240 to more quickly heat resonator 212 since thermal mass is minimized. Alternatively, some thermal conduction is desirable to minimize temperature rise of oscillator 210 due to self-heating. In general, the latter is less of a concern since the power levels and self-heating of oscillator 210 is relatively minimal.

Temperature sensor 220 may employ a variety of devices to measure the temperature of resonator 212 in oscillator 210. In one embodiment, temperature sensor 220 employs a diode to detect a change in temperature due to the change in its forward bias voltage as a function of temperature. Other devices and circuits may be employed.

Figure 3:
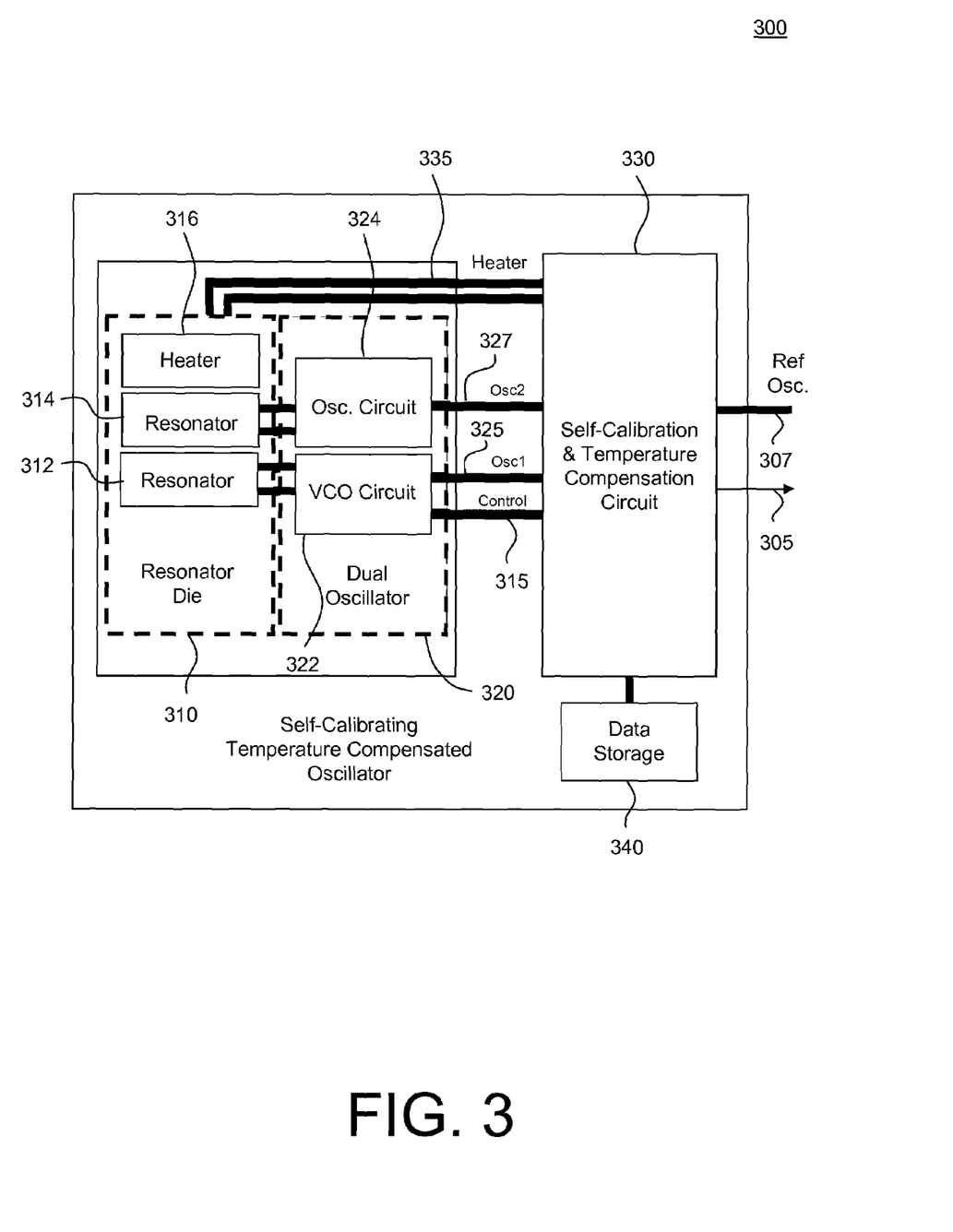
FIG. 3 shows a more detailed functional block diagram of one embodiment of a self-calibrating temperature compensated oscillator.

FIG. 3 shows a more detailed functional block diagram of one embodiment of an SCTCO 300. SCTCO 300 includes a monolithic structure 310, a first oscillator circuit 322, a second oscillator circuit 322, a self calibration & temperature compensation block 330, and data storage 340. Monolithic structure 310 ("Resonator Die 310") includes first resonator 312, second resonator 314, and heating element 316. SCTCO 300 also has a reference oscillator input 307 that receives a reference oscillator input signal, and an SCTCO output 305 that outputs a temperature compensated reference oscillator output signal.

First oscillator circuit 322 employs first resonator 312, and second oscillator circuit 324 employs second resonator 314. First oscillator circuit 322 comprises an oscillation circuit whose output frequency can be modified electronically via a control signal 315. In one embodiment, first oscillator circuit 322 is a Voltage Controlled Oscillator (VCO) having whose oscillating frequency can be changed in response to a control voltage. In that case, first oscillator circuit 322 may include one or more varactors, switched capacitors, or a combination of varactor(s) and switched capacitors.

In SCTCO 300, first resonator 312 has a temperature coefficient with a low magnitude, and the corresponding first oscillator circuit 322 operates as the reference oscillator which outputs a first oscillator signal 325 which is output as a temperature compensated reference oscillator output signal via SCTCO output 305. For example, first resonator 312 may have a temperature coefficient of +3 ppm/° C. Various methods and techniques are known in the art for producing first resonator 312 with a temperature coefficient with a relatively low magnitude. Second resonator 314 exhibits a monotonically changing frequency vs. temperature characteristic and has a temperature coefficient whose magnitude is significantly higher than that of first resonator 312 (e.g., −30 ppm/° C.). In a beneficial embodiment, the magnitude of the temperature coefficient of second resonator 314 is at least four times that of first resonator 312. As will be explained in further detail below, this allows second oscillator circuit 324 to be employed as a temperature sensor for first oscillator circuit 322.

Figure 4:
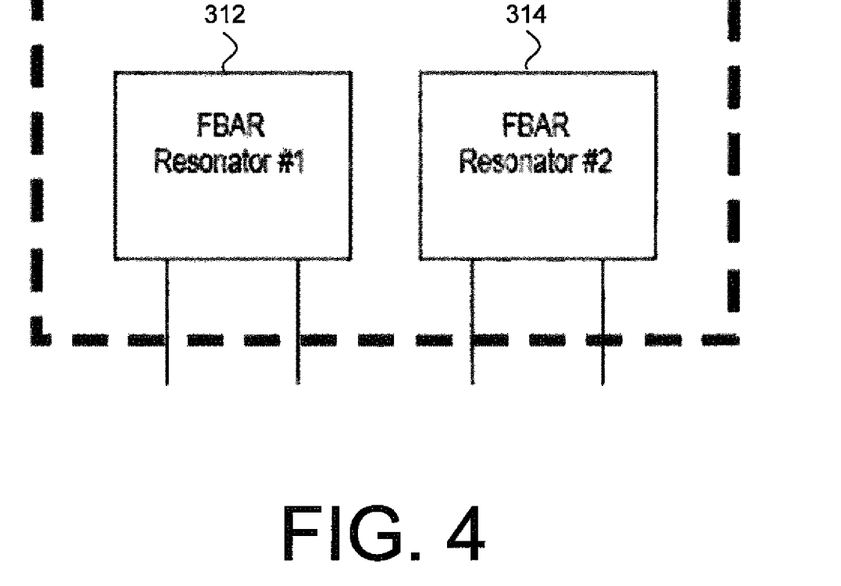
FIG. 4 shows a representation of a monolithic die implementation containing two resonators on a single substrate.

FIG. 4 shows a representation of a monolithic die implementation including first resonator 312 and second resonator 314 on a single substrate. Because they are on a same die, the temperature coupling between first resonator 312 and second resonator 314 is very high while the small die size results in very low thermal mass. Pins for connecting to first resonator 312 and second resonator 314 to corresponding first and second oscillator circuits 322 and 324 are also represented in FIG. 4.

Figure 5:
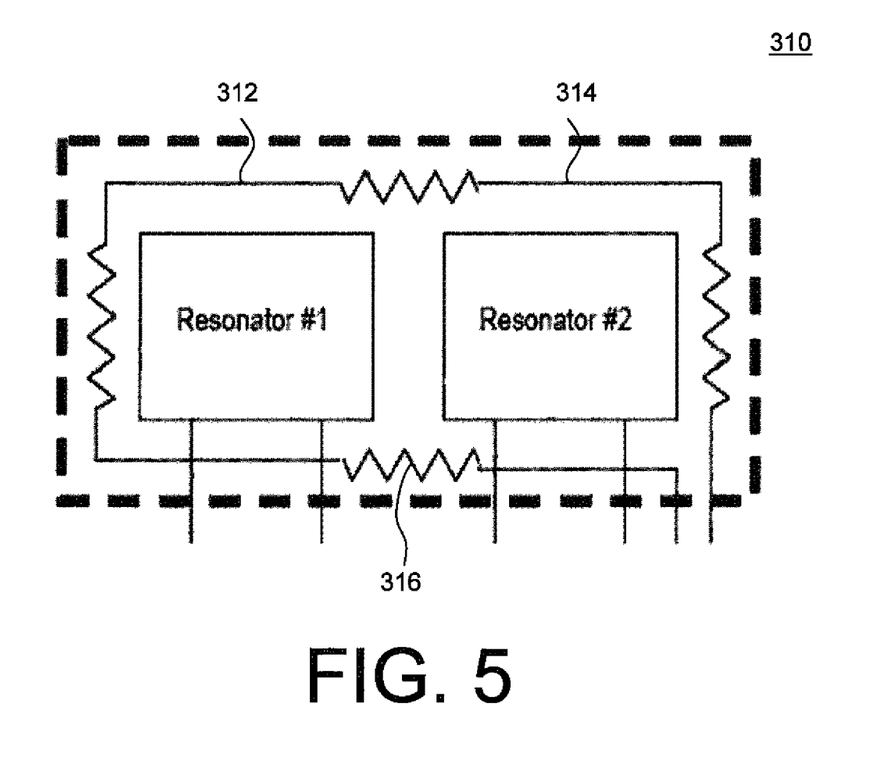
FIG. 5 shows a representation of a monolithic die implementation containing two resonators and a heating element on a single substrate.

FIG. 5 shows a representation of Resonator Die 310 including first resonator 312, second resonator 314, and heating element 316 on a single substrate. Heating element 316 is represented by resistor elements along the periphery of and surrounding first and second resonators 312 and 314. Two pins for heating element 316 are provided to supply power thereto during the self-calibration mode of operation of SCTCO 300. This configuration of Resonator Die 310 has excellent properties in quickly heating first and second resonators 312 and 314 during self-calibration, or providing a more general temperature sensing element.

Additionally, first and second oscillator circuits 322 and 324 may both be integrated in a monolithic structure on a single die ("Dual Oscillator Die 320"). Furthermore, Dual Oscillator Die 320 and Resonator Die 310 may be integrated in various ways, e.g., monolithically, wafer scale bonding or packaging, or other multi-chip module (MCM) packaging. Although the configuration of Dual Oscillator Die 320 is advantageous, alternatively first and second oscillator circuits 322 and 324 may be fabricated on separate dies in SCTCO 300.

During self-calibration and in normal operation, first oscillator circuit 322 outputs first oscillator signal 325 and second oscillator circuit 324 outputs second oscillator signal 327. As explained below, combined with an external reference, first and second oscillator signals 325 and 327 permit the temperature of first resonator 312 to be accurately measured during calibration and in normal operation and used for compensation of the temperature compensated reference oscillator output signal that is output by SCTCO output 305 of SCTCO 300.

Figure 6:
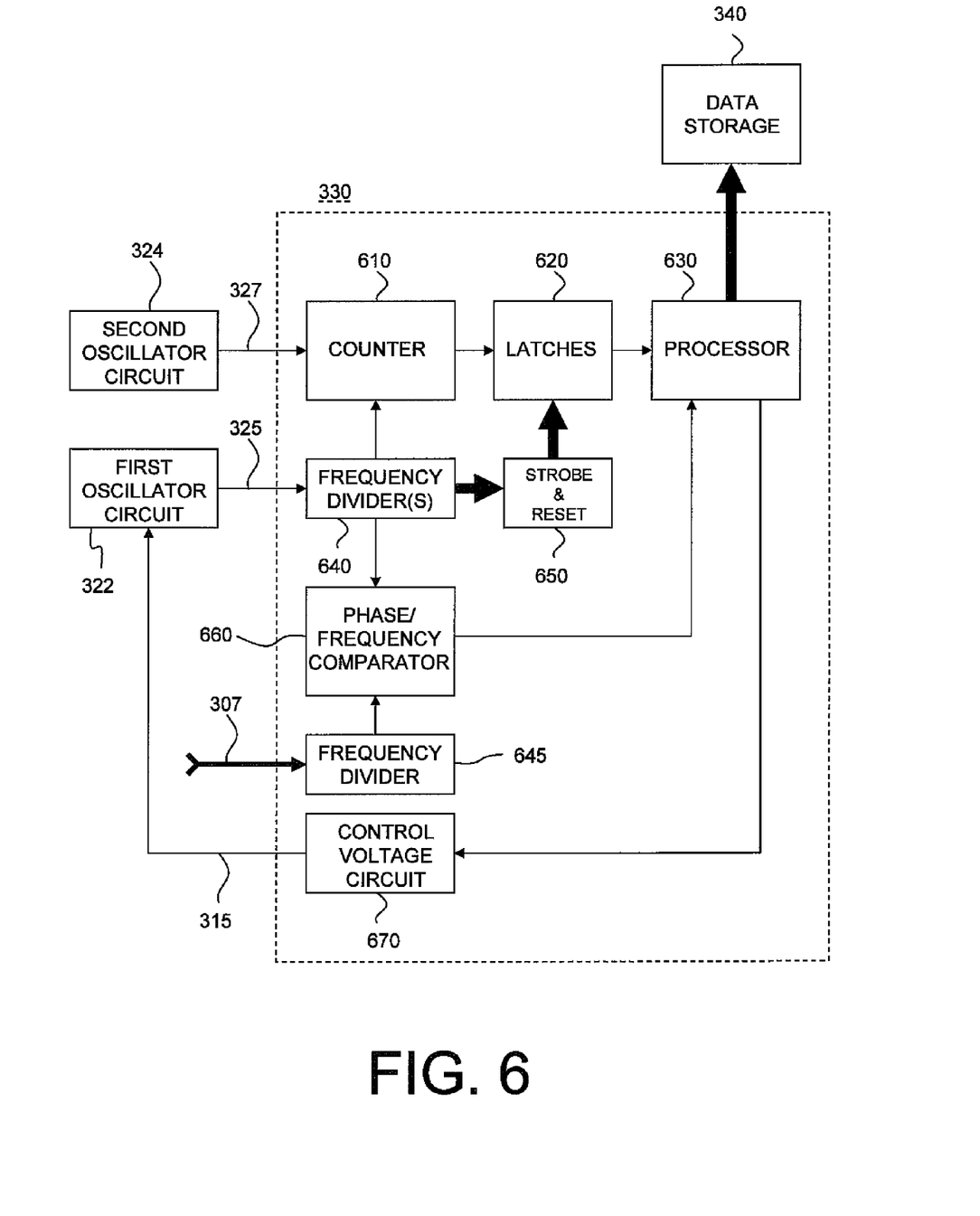
FIG. 6 is a functional block diagram of one embodiment of a self calibration & temperature compensation block during a calibration operation.

FIG. 6 is a functional block diagram of one embodiment of a self calibration & temperature compensation block 330 as configured during a self-calibration operation. As will be appreciated by those skilled in the art, the various functions shown in FIG. 6 may be physically implemented using a software-controlled microprocessor, hard-wired logic circuits, or a combination thereof. Also, while the functional blocks are illustrated as being segregated in FIG. 6 for explanation purposes, they may be combined in any physical implementation.

Self calibration & temperature compensation block 330 includes counter 610, latches 620, processor 630, frequency divider(s) 640, reference frequency divider 645, strobe & reset block 650, phase/frequency comparator 660, and control signal generating unit 670. Depending upon the various frequencies of the reference oscillator input signal on reference oscillator 307 and the temperature compensated reference oscillator output signal, reference frequency divider 645 may be omitted.

During the self-calibration sequence, the temperature of the first oscillator circuit 322, including first resonator 312, and second oscillator circuit 324, including second resonator 314, are ramped up from the starting ambient temperature to the desired high operating temperature. The ramping of the temperature is controlled by applying power to the heater control lines 335 from the self calibration & temperature compensation block 330 to heating element 316 on Resonator Die 310. As the temperature changes, the output frequencies of first and second oscillator signals 325 and 327 also change. At this time, because the temperature coefficient of second resonator 314 is substantially larger than that of first resonator 312, the frequency of second oscillator circuit 324 will change much more than the frequency of first oscillator circuit 322.

Accordingly a temperature shift can be determined by measuring a change in the difference in frequency between first and second oscillator signals 325 and 327. Because second oscillator 324 uses second resonator 314 with temperature coefficient having a higher magnitude, the difference in frequency between first and second oscillator signals 325 and 327 will change significantly with temperature (i.e., the otherwise-uncompensated output frequencies of first and second oscillator signals 325 and 327 will diverge as their temperature is changed). In the embodiment of self calibration & temperature compensation block 330 shown in FIG. 6, the change in the difference in frequency between first and second oscillator signals 325 and 327 is measured via frequency divider 640, counter 610, strobe & reset block 650, and latches 620. The measured frequency shift is referred to herein as "Temperature Shift Data" and is provided to processor 630 and thence stored in data storage 340.

As an example, if second oscillator circuit 324 is nominally operating at 1.0 GHz at ambient temperature with a temperature coefficient of −30 ppm/° C., a temperature increase of 5° C. will result in a negative output frequency shift of 150 kHz in second oscillator signal 327. Meanwhile, if first oscillator circuit 322 is nominally operating at 1.0 GHz at ambient temperature with a temperature coefficient of +3 ppm/° C., the same temperature increase of 5° C. would result in a positive output frequency shift of 15 kHz in first oscillator signal 325.

During calibration, a reference oscillator input signal having a stable frequency with a known relationship to the desired operating frequency for SCTCO 300 is provided at input 307. In particular, if frequency divider(s) 640 divides the frequency, $F_{OUT}$, of first oscillator signal 325 by N, and if reference frequency divider 645 divides the frequency, $F_{IN}$, of the reference oscillator input signal by M, then:

$$F_{OUT} = (N/M) * F_{IN} \quad (1)$$

During calibration, any shift in the frequency of first oscillator signal 325 due to temperature changes can be determined by measuring the relationship between the frequency $F_{OUT}$ of first oscillator signal 325 and the stable frequency $F_{IN}$ of the reference oscillator input signal received via the Reference Oscillator input 307 by means of phase/frequency comparator 660. In particular, phase/frequency comparator 660 measures the difference in frequency between the frequency $F_{OUT}/N$ of the divided oscillator signal 325 output by frequency divider(s) 640, and the frequency $F_{IN}/M$ of the divided reference oscillator input signal output by reference frequency divider 645, and provides this difference to processor 630. Processor 630 in turn provides a feedback signal to control signal generating unit 670. Self calibration & temperature compensation block 330 then applies control signal 315 to first oscillator circuit 322 via control signal generating unit 670 during the self-calibration sequence to close a calibration feedback loop to shift the frequency of first oscillator circuit 322 and first oscillator signal 325 to its nominal operating frequency. Control signal generating unit 670 outputs the control signal 315 to drive $F_{OUT}/N$ to be equal to $F_{IN}/M$. Once the output of phase/frequency comparator 660 indicates that the $F_{OUT}/N$ is the same as $F_{IN}/M$ (i.e., first oscillator signal 325 is at its normal desired operating frequency, $F_{OUT}$), then the magnitude of the correction required to correct the output frequency of first oscillator circuit 322, referred to herein as "Oscillator Correction Data," is stored by processor 630 in data storage 340. So, the corrected first oscillator signal 325 remains at its desired frequency (e.g., 1.0 GHz) during calibration as the temperature of first and second resonators 312 and 314 is varied by heater 316. The corrected first oscillator signal 325 (or reference oscillator input signal received via the Reference Oscillator input 307) is divided in frequency and used with counter 610 to measure the frequency shift of second oscillator circuit 324 and second oscillator signal 327 (e.g., 150 kHz) and thereby determine the Temperature Shift Data for storage in data storage 340.

Together the "Oscillator Correction Data" and the "Temperature Shift Data" are stored in data storage 340 as frequency calibration "Data Pairs" for multiple temperatures spanning the operating temperature range of SCTCO 300. The temperature is ramped from an ambient to the desired high temperature. This may be done with high resolution limited by the design of the accuracy of the frequency shift measurement technique and temperature coefficients of the resonators. The entire set of frequency calibration data characterizes the frequency vs. temperature behavior of first oscillator circuit 322 and first oscillator signal 325.

Self-calibration may be done once, when SCTCO 300, or a host device (e.g., a wireless communication device such as a cellular phone) incorporating SCTCO 300, is manufactured. In this case, the reference oscillator input signal at Reference Oscillator input 307 may be applied directly to the host device for the self-calibration. In one embodiment, during factory calibration, the reference oscillator input may be produced from a wireless signal received by the wireless communication device in the factory.

The frequency calibration data set may be expanded by interpolation and/or extrapolation.

For interpolation, the frequency calibration data can be curve-fit, for example, by applying a polynomial curve fit over the entire temperature range, or by applying multiple polynomial curve-fits over portions of the temperature range. Other functions in addition to polynomials may also be used for better results depending upon the characteristic response of the data being fit. In one particular beneficial embodiment, a fifth-order polynomial curve fit is applied for interpolating data between measured data points.

If the starting ambient temperature of the self-calibration process is above the lower temperature specification of operation of SCTCO 300, for example, then it may be desirable to extrapolate the measured frequency calibration data to provide as much correction as possible to non-calibrated temperatures above or below the measured temperature range. For example, the device may self-test between 20° C. and 70° C., but improved temperature compensation is desired from −40° C. to 85° C. This may be done algorithmically in self calibration & temperature compensation block 330 by estimating the control signal (e.g., the magnitude of a control voltage) required at a particular temperature to drive the frequency of first oscillator signal 325 to be the same as its normal desired operating frequency. The estimation may be done using a curve fitting function to determine what the "expected" control signal 315 would be. For example, curve-fit data from the 20° C.-70° C. measurements could be extrapolated beyond the 20° C.-70° C. range. In one embodiment, a second-order curve fit is provided for the measured data and this curve-fit is then used to develop the extrapolated calibration data. Furthermore, in another embodiment, a second-order curve fit of a subset of the measured data may be used to develop the extrapolated data. For example, a second-order curve fit of measured data from 20° C. to 40° C. may be used to develop extrapolated data for lower temperatures, and another second-order curve fit of measured data from 50° C. to 70° C. may be used to develop extrapolated data for higher temperatures.

In another embodiment, wafer level measurement data or "typical" performance-measured data up to the second order range could supplement the self-test data. Known characteristics of the nominal temperature behavior of SCTCO 500 could be combined with any of the above to further improve the temperature compensated performance.

Resonators may also exhibit drift in performance over time due to aging or due to other factors such as changes in humidity. To address this, it is possible for SCTCO 300 to recalibrate itself periodically. In the case of installation in a wireless communication device such as a cellular phone, for example, the wireless infrastructure signal from a base station accessed by the host device may be utilized to provide the reference oscillator input signal at Reference Oscillator input 307. As a colder ambient environment may not be convenient, previous calibration data outside the temperature range of the new calibration sequence may be combined with newly measured data. In some embodiments, periodic recalibration may be as simple as adjusting an offset frequency at one measured temperature and applying it across the temperature range.

Also, when SCTCO is included in a host device, such as a wireless communication device (e.g., a cellular telephone, GPS receiver), then one or more functional blocks in FIGS. 3 and 6 (e.g., data storage 340, processor 630, etc.) may be omitted and their functions may be performed by elements (e.g., memory, a processor, etc.) already present in the host device, and/or functional blocks (e.g., 330, 322, 324, etc.) may be monolithically integrated into other components of the host device.

Figure 7:
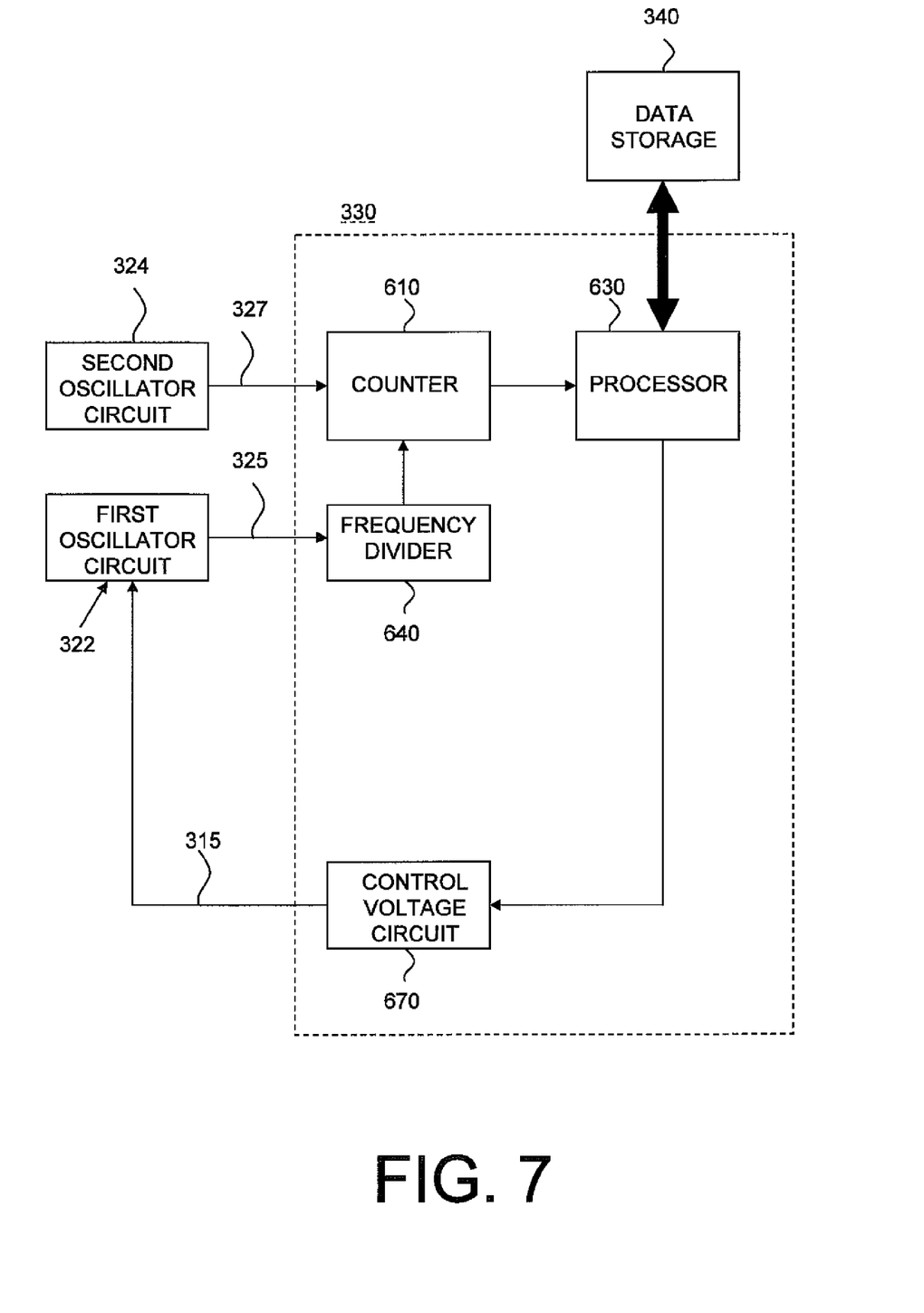
FIG. 7 is a functional block diagram of one embodiment of a self calibration & temperature compensation block during normal operation.

FIG. 7 is a functional block diagram of one embodiment of a self calibration & temperature compensation block 300 during normal operation.

During normal operation, heating element 316 is typically turned off and no power is applied to heater control lines 335. The frequency of second oscillator circuit 324 is measured by frequency divider 640 and counter 610 using first oscillator circuit 322 as a reference frequency, similar to during the calibration operation. The frequency shift of second oscillator circuit 324 is provided to processor 630 as Temperature Shift Data. This Temperature Shift Data is then matched the Temperature Shift Data stored in data storage 340 during the calibration process to determine the temperature of resonator 312 and to select the corresponding Oscillator Correction Data from data storage 340. Processor 630 then applies the proper control signal 315 to first oscillator circuit 322 via control signal generating unit 670. As a change in the control signal 315 shifts the frequency of first oscillator circuit 322 this will in turn result in a corrected measurement of the frequency of second oscillator circuit 324 and therefore a correction in the Oscillator Correction Data and control voltage applied via control signal 315 to first oscillator circuit 322. This feedback loop is designed to be stable and converge quickly for the system outlined.

Even better frequency stability of the temperature compensated reference oscillator output signal may be achieved by operating SCTCO 300 as an oven-controlled oscillator, which may be desirable in certain applications.

So it is seen that various embodiments of SCTCO 300 may include one or more of the following benefits and features. In that case, it would not be necessary to calibrate SCTCO 300 over such a wide temperature range. So it is possible that the architecture could be simplified.

SCTCO 300 provides a monolithic combination of a first resonator having a temperature coefficient with a relatively low magnitude, a second resonator having a temperature coefficient with a relatively greater magnitude, and a heater element. The resonators can be film bulk acoustic resonators (FBARs), bulk acoustic wave (BAW) resonators, surface acoustic wave (SAW) resonators, or similar resonant structures. Also, in other embodiments, other packaging techniques and heat sources may be employed that tightly couple the resonator having the lower temperature coefficient, the temperature-sensing resonator having the larger temperature coefficient, and the heat source.

The low temperature coefficient resonator and the higher temperature coefficient resonator are employed in oscillator circuits that perform self-calibration testing over a temperature range to algorithmically further improve the temperature performance of the oscillator using the low temperature coefficient resonator.

Furthermore, the integration of SCTCO 300 into other consumer/commercial electronic devices such as wireless communication devices, GPS receivers, personal digital assistants (PDAs), laptops wireless interfaces, etc. can provide certain synergies as described above. For example, an external reference signal can be used to self-calibrate SCTCO 300 over a self-heated temperature range, either provided directly to the device during or after manufacturing, or a signal extracted from the environment in which a wireless communication device such as a cellular phone is capable of operating. This would allow use of the stable reference frequency of known accuracy obtained from a wireless signal received, for example, from a base station or in the case of GPS, from a satellite.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A self-calibrating temperature compensated oscillator, comprising:
    a first resonator, a second resonator, and a heating element adapted to heat the first and second resonators in response to a heater control signal, where a temperature coefficient of the second resonator is substantially greater than a temperature coefficient of the first resonator;
    a first oscillator circuit adapted to operate in conjunction with the first resonator and to output a first oscillator output signal having a first oscillating frequency, the first oscillating frequency being variable in response to a control signal;
    a second oscillator circuit adapted to operate in conjunction with the second resonator and to output a second oscillator output signal having a second oscillating frequency;
    a temperature determining circuit for determining a temperature of the first resonator using the second oscillating frequency; and
    a temperature compensator adapted to provide the control signal to the first oscillator in response to the determined temperature to maintain the first oscillator output signal at a desired operating frequency,
    wherein the temperature determining circuit includes a counter for receiving the second oscillator output signal and being clocked by the first oscillator output signal to produce a signal indicating the second oscillating frequency, where the second oscillating frequency corresponds to the temperature of the first resonator.

2. The self-calibrating temperature compensated oscillator of claim 1, further comprising a calibration unit adapted to measure the second oscillating frequency using the first oscillating frequency as a reference and to determine the temperature of the first resonator based on the measured second oscillating frequency as power is applied to the heating element to vary the temperature of the first resonator across a temperature range.

3. The self-calibrating temperature compensated oscillator of claim 2, wherein the calibration component includes:
  a comparator for comparing a first fraction of the first oscillating frequency, $F_1/N$, to a second fraction of a frequency of an external reference signal, $F_{IN}/M$, during a calibration operation, and to produce a frequency difference signal indicating at least a frequency difference between $F_1/N$ and $F_{IN}/M$; and
  a control signal generating unit adapted to provide the control signal to the first oscillator during the calibration operation in response to the frequency difference signal, to drive the first oscillating frequency to be the same as the reference frequency.

4. The self-calibrating temperature compensated oscillator of claim 3, wherein the self-calibrating temperature compensated oscillator is provided in a wireless device, and wherein the external reference signal is produced from a wireless signal received by the wireless device.

5. The self-calibrating temperature compensated oscillator of claim 1, further comprising a data storage device adapted to store frequency calibration data for the self-calibrating temperature compensated oscillator, wherein the determined temperature is used with the frequency calibration data to determine the control signal to be provided to the first oscillator to maintain the first oscillator output signal at the desired operating frequency.

6. The self-calibrating temperature compensated oscillator of claim 1, wherein the temperature coefficient of the second resonator is at least four times greater than the temperature coefficient of the first resonator.

7. The self-calibrating temperature compensated oscillator of claim 1, wherein the temperature compensator includes:
  a data storage device adapted to store frequency calibration data for the self-calibrating temperature compensated oscillator, wherein the determined temperature is used with the frequency calibration data to retrieve control data from the data storage device corresponding to the determined temperature; and
  a control signal generating unit adapted to provide the control signal to the first oscillator in response to the retrieved control data.

8. The self-calibrating temperature compensated oscillator of claim 1, wherein the first and second resonators are each one of a film bulk acoustic resonator (FBAR) and a bulk acoustic wave (BAW) device.

9. The self-calibrating temperature compensated oscillator of claim 1, wherein the heating element is adapted to heat the first resonator to a desired operating temperature such that the self-calibrating temperature compensated oscillator is an oven-controlled oscillator.

10. A method of calibrating a self-calibrating temperature compensated oscillator comprising a first oscillator circuit adapted to operate in conjunction with a first resonator and to output a first oscillator output signal having a first oscillating frequency, the first oscillating frequency being variable in response to a control signal, and a second oscillator circuit adapted to operate in conjunction with a second resonator and to output a second oscillator output signal having a second oscillating frequency, the method comprising:
  (1) heating the first resonator to a particular temperature using a heating element provided on a same monolithic structure as the first resonator;
  (2) providing a control signal to the first oscillator to maintain the first oscillator output signal at a desired operating frequency;
  (3) determining the second oscillating frequency of the second oscillator circuit using the first oscillating frequency as a reference;
  (4) storing in data storage frequency calibration data for the particular temperature comprising data corresponding to the second oscillating frequency of the second oscillator circuit and data corresponding to the control signal provided to the first oscillator to maintain the first oscillator output signal at the desired operating frequency; and
  (5) repeating steps (1)-(4) for a plurality of temperatures spanning a test temperature range.

11. The method of claim 10, wherein heating the first resonator includes also heating the second resonator using a heating element provided on a monolithic structure that further includes the first resonator and, the second resonator.

12. The method of claim 10, wherein providing a control signal to the first oscillator to maintain the first oscillator output signal at a desired operating frequency comprises
  providing an external reference signal having a frequency $F_{IN}$;
  comparing a first fraction of the first oscillating frequency, $F_1/N$, to $F_{IN}/M$;
  producing a frequency difference signal indicating at least a frequency difference between $F_1/N$ and $F_{IN}/M$; and
  in response to the frequency difference signal, providing the control signal to the first oscillator to drive the first oscillating frequency to be the same as the reference frequency.

13. The method of claim 12, wherein the self-calibrating temperature compensated oscillator is provided in a wireless device, and wherein providing the external reference signal comprises receiving from a wireless signal received by the wireless device.

14. The method or claim 10, further comprising fitting an equation to at least a portion of the frequency calibration data and using the equation to interpolate frequency calibration data at temperature points between the temperatures measured in steps (1)-(5).

15. The method of claim 10, further comprising extrapolating the frequency calibration data across an operating temperature range that is greater than the test temperature range.

16. The method of claim 15, wherein extrapolating the frequency calibration data across an operating temperature range that is greater than the calibration temperature range comprises fitting an equation to at least a portion of the frequency calibration data and using the equation to extrapolate the frequency calibration data across the operating temperature range.

17. The method of claim 10, wherein the first and second resonators are each one of a film bulk acoustic resonator (FBAR) and a bulk acoustic wave (BAW) device.

18. A self-calibrating temperature compensated oscillator, comprising:
  a monolithic wafer die comprising a first resonator, a second resonator, and a heating element and adapted to heat the first and second resonators in response to a heater control signal, where a temperature coefficient of the second resonator is substantially greater than a temperature coefficient of the first resonator;
  a first oscillator circuit adapted to operate in conjunction with the first resonator and to output a first oscillator output signal having a first oscillating frequency, the first oscillating frequency being variable in response to a control signal;

a second oscillator circuit adapted to operate in conjunction with the second resonator and to output a second oscillator output signal having a second oscillating frequency;

a temperature determining circuit for determining a temperature of the first resonator using the second oscillating frequency; and a temperature compensator adapted to provide the control signal to the first oscillator in response to the determined temperature to maintain the first oscillator output signal at a desired operating frequency.

19. The self-calibrating temperature compensated oscillator of claim 18, wherein the temperature determining circuit includes a counter for receiving the second oscillator output signal and being clocked by the first oscillator output signal to produce a signal indicating the second oscillating frequency, where the second oscillating frequency corresponds to the temperature of the first resonator.

20. The self-calibrating temperature compensated oscillator of claim 18, further comprising a calibration unit adapted to measure the second oscillating frequency using the first oscillating frequency as a reference and to determine the temperature of the first resonator based on the measured second oscillating frequency as power is applied to the heating element to vary the temperature of the first resonator across a temperature range.

* * * * *